US008642956B2

(12) United States Patent
Fober

(10) Patent No.: US 8,642,956 B2
(45) Date of Patent: Feb. 4, 2014

(54) TRANSMISSION ELECTRON MICROSCOPE AND METHOD OF OPERATING A TRANSMISSION ELECTRON MICROSCOPE

(75) Inventor: Joerg Fober, Heuchlingen (DE)

(73) Assignee: Carl Zeiss Microscopy GmbH, Jena (DE)

(*) Notice: Subject to any disclaimer, the term of this patent is extended or adjusted under 35 U.S.C. 154(b) by 43 days.

(21) Appl. No.: 13/337,033

(22) Filed: Dec. 23, 2011

(65) Prior Publication Data

US 2013/0092836 A1    Apr. 18, 2013

(30) Foreign Application Priority Data

Dec. 27, 2010 (DE) .......................... 10 2010 056 337

(51) Int. Cl.
*H01J 37/26* (2006.01)
*G01N 23/00* (2006.01)
*G21K 5/00* (2006.01)

(52) U.S. Cl.
USPC ............ 250/305; 250/309; 250/307; 250/311

(58) Field of Classification Search
USPC ...... 250/305–307, 309–311, 396 R, 396 ML, 250/397, 492.3
See application file for complete search history.

(56) References Cited

U.S. PATENT DOCUMENTS

| | | | |
|---|---|---|---|
| 4,740,704 A | 4/1988 | Rose et al. | |
| 5,061,850 A * | 10/1991 | Kelly et al. | 850/1 |
| 5,097,126 A * | 3/1992 | Krivanek | 250/305 |
| 5,393,977 A * | 2/1995 | Okura et al. | 850/10 |
| 6,111,253 A * | 8/2000 | Tsuno | 250/311 |
| 6,140,645 A * | 10/2000 | Tsuno | 250/311 |
| 6,239,430 B1 * | 5/2001 | Weimer et al. | 250/305 |
| 6,323,485 B1 * | 11/2001 | Tsuno | 250/311 |
| 6,384,412 B1 * | 5/2002 | Krahl et al. | 250/305 |
| 6,770,878 B2 * | 8/2004 | Uhlemann et al. | 250/305 |
| 6,933,500 B2 * | 8/2005 | Kaji et al. | 250/311 |

(Continued)

FOREIGN PATENT DOCUMENTS

DE    44 33 524 A1    3/1996
DE    44 33 531 A1    3/1996

(Continued)

OTHER PUBLICATIONS

J. Nelayah et al., "Direct imaging of surface plasmon resonances on single triangular silver nanoprisms at optical wavelength using low-loss EFTEM imaging", Optics Letters, vol. 34, No. 7, Apr. 1, 2009, pp. 1003-1005.

(Continued)

*Primary Examiner* — Bernard E Souw
(74) *Attorney, Agent, or Firm* — Bruce D Riter

(57) ABSTRACT

A transmission electron microscope comprises a high-voltage source for outputting a high voltage at two high-voltage outputs and outputting a control signal at a controller output; a focusing lens for focusing a beam; a monochromator which allows only those particles of the particle beam to pass whose kinetic energy is within an adjustable energy interval; an energy-dispersive component which deflects particles of different kinetic energies differently; a detector; and a controller connected to the controller output, which controls a beam deflector, arranged between the energy-dispersive component and the detector, the monochromator, or the energy-dispersive component in dependence on the control signal, or superposes plural of intensity distributions detected by the detector with an offset relative to one another, which offset is set in dependence on the control signal.

2 Claims, 2 Drawing Sheets

(56) References Cited

U.S. PATENT DOCUMENTS

| | | |
|---|---|---|
| 7,339,167 B2 * | 3/2008 | Ohshima et al. .............. 250/310 |
| 7,777,185 B2 * | 8/2010 | de Jonge ....................... 250/311 |
| 2004/0094712 A1 * | 5/2004 | Kaji et al. ..................... 250/310 |
| 2005/0127295 A1 * | 6/2005 | Kaji et al. ..................... 250/311 |
| 2005/0167589 A1 * | 8/2005 | Kaji et al. ..................... 250/311 |
| 2006/0076489 A1 * | 4/2006 | Ohshima et al. .............. 250/310 |
| 2007/0194225 A1 * | 8/2007 | Zorn .............................. 250/306 |
| 2009/0078868 A1 * | 3/2009 | de Jonge ....................... 250/310 |
| 2010/0296320 A1 * | 11/2010 | Fober ............................... 363/46 |
| 2012/0080594 A1 * | 4/2012 | Schnell ......................... 250/306 |
| 2012/0318975 A1 * | 12/2012 | Fober et al. ................... 250/306 |

FOREIGN PATENT DOCUMENTS

| | | |
|---|---|---|
| DE | 196 33 496 B4 | 6/2006 |
| DE | 10 2010 002 617 A1 | 9/2010 |
| DE | 10 2010 041 813 A1 | 4/2012 |
| EP | 0 967 630 B1 | 8/2003 |

OTHER PUBLICATIONS

W. Sigle et al., "Electron energy losses in Ag nanoholes-from localized surface plasmon resonances to ring of fire", Optics Letters, vol. 34, No. 14, Jul. 15, 2009, pp. 2150-2152.

K. Yoshida et al., "Position Control of Electron Energy Loss Spectrum in Case of Accelerating-Voltage Fluctuation", Japanese Journal of Applied Physics, vol. 29, No. 11, Nov. 1990, pp. 2531-2534.

P. Kruit et al., "Position Stabilization of EELS Spectra", Journal of Electron Microscopy Technique, vol. 2, 1985, pp. 167-169.

B. Schaffer et al., "Automated spatial drift correction for EFTEM image series", Ultramicroscopy, vol. 102, 2004, pp. 27-36.

Office action in German patent application No. 10 2010 056 337.4 dated Jul. 15, 2011, pp. 7 (with English translation, pp. 6).

* cited by examiner

TRANSMISSION ELECTRON MICROSCOPE AND METHOD OF OPERATING A TRANSMISSION ELECTRON MICROSCOPE

CROSS-REFERENCES TO RELATED APPLICATIONS

The present application claims priority of Patent Application No. 10 2010 056 337.4, filed Dec. 27, 2010 in Germany, entitled "PARTICLE BEAM SYSTEM AND SPECTROSCOPY METHOD", the content of which is hereby incorporated by reference in its entirety.

FIELD

The invention relates to transmission electron microscopes (TEMs) and to methods of operating transmission electron microscopes. The invention in particular relates to transmission electron microscopes and methods of operating transmission electron microscopes for performing spectroscopic measurements of a sample, such as recording energy loss spectra that are representative of energy losses experienced by electrons while interacting with the sample.

BACKGROUND

Energy loss spectra are suitable for detecting elementary excitations of a sample, such as excitation of surface plasmons in the sample, for example. To this end, for example a monochromatic electron beam can be directed onto the sample, resulting in excitations of the sample and a reduction of the kinetic energy of electrons of the beam by an amount corresponding to the energy of the excitation. If an energy spectrum of the electron beam subsequent to its interaction with the sample is recorded, the recorded energy spectrum contains information relating to the excitation energies. The articles J. Nelayah, L. Gu, W. Sigle, C. T. Koch, I. Pastoriza-Santos, L. M. Liz-Marzán, and P. A. van Aken, "Direct imaging of surface plasmon resonances on single triangular silver nanoprisms at optical wavelength using low-loss EFTEM imaging", Opt. Lett. 34, 1003-1005 (2009) and Wilfried Sigle, Jaysen Nelayah, Christoph T. Koch, and Peter A. van Aken, "Electron energy losses in Ag nanoholes—from localized surface plasmon resonances to rings of fire," Opt. Lett. 34, 2150-2152 (2009) describe applications of this method.

SUMMARY

It is an object of the present invention to propose a particle beam system and a spectroscopy method which can be used to record energy loss spectra with a higher degree of accuracy.

According to embodiments, a particle beam system comprises a high-voltage source for providing a high voltage at a high-voltage output of the high-voltage source and providing a control signal, which is indicative of a deviation of the provided high voltage from a reference voltage or of a temporal change or fluctuation of the high voltage, at a controller output of the high-voltage source, an acceleration electrode, which is electrically connected to the high-voltage output, for accelerating the particles in a particle beam to a kinetic energy that corresponds to the high voltage, a focusing lens, which is arranged in the beam path of the particle beam downstream of the acceleration electrode, for focusing the beam onto a location of a sample, an energy-dispersive component, which is arranged in the beam path of the particle beam downstream of the sample and is configured to deflect particles of different kinetic energies differently, a detector, which is arranged in the beam path downstream of the energy-dispersive component, and a controller, which is connected to the controller output of the high-voltage source and is configured to effect, in dependence on the control signal provided by the high-voltage source, changes in operating parameters of the energy-dispersive component or of other particle-optical components arranged in the beam path of the particle beam or to correct intensities detected by the spatially resolving detector with respect to the energy.

The inventor has recognized that instabilities in a high-voltage source providing an acceleration voltage for a particle beam that is used for the measurement are the cause of a limit on the resolution that can be achieved when measuring energy loss spectra. It is therefore conceivable to better stabilize high-voltage sources used for providing the acceleration voltage. In conventional high-voltage sources for particle beam systems, however, considerable measures for stabilizing said high-voltage sources are employed already, which incur substantial costs and cannot satisfactorily prevent still remaining instabilities, in particular drifting and low-frequency noise.

In order to achieve the abovementioned object it is proposed therefore to accept a certain instability of the high-voltage source and to detect changes in the high voltage or deviations of the provided high voltage from a reference voltage and to undertake correction measures at another point in the beam path of the particle beam before or after interaction with the sample.

According to an exemplary embodiment, the particle beam system comprises a beam deflector, which is arranged in the beam path between the energy-dispersive component and the spatially resolving detector. The beam deflector can provide an adjustable electric or magnetic field that has a deflecting effect on the particle beam or adjustably deflect the particle beam in another way. The beam deflector is controlled by the controller in dependence on the control signal provided by the high-voltage source. In particular, the deflection angle for the particle beam produced by the beam deflector is increased or decreased here if the deviation of the high voltage provided by the high-voltage source from the setpoint voltage increases or decreases.

With this measure it is possible to improve the quality of the energy loss spectrum detected by the spatially resolving detector. Without the controller actuating the beam deflector, a relative increase in the high voltage provided by the high-voltage source would, for example, result in a relative increase in the kinetic energy of the particles in the beam. However, independently of their kinetic energy, the particles experience equal energy losses at the sample that corresponds to the energies of the excitations in the sample. An energy spectrum that is recorded using the spatially resolving detector downstream of the energy-dispersive component is thus shifted to higher energies owing to the relative increase in the high voltage, without changing its relative form that is defined by the unchanging energy losses. A high voltage that varies while the spectrum is recorded using the spatially resolving detector thus results in smearing of the recorded spectrum. Owing to the beam deflector, which is arranged between the energy-dispersive component and the spatially resolving detector, being actuated as explained above, it is possible, after appropriate calibration, to entirely avoid the spectrum shifting to higher or lower energies, with the result that a stable energy loss spectrum can be recorded.

According to a further exemplary embodiment, the particle beam system comprises an actuator, which is configured to displace the detector in a direction transverse to the beam path or an incidence direction of the particles on the detector. The actuator is controlled by the controller in dependence on the control signal provided by the high-voltage source.

Similar to the case where the previously described beam deflector is used, it is possible, by actuating the actuator to displace the detector, to compensate for shifts, caused by changes in the high voltage, in the energy spectrum, which is recorded using the detector, such that the same energy loss spectra can be recorded for different high voltages.

According to a still further exemplary embodiment, the particle beam system comprises a high-voltage source for providing a high voltage at a high-voltage output and for providing a control signal, which is indicative of a deviation of the provided high voltage from a reference voltage, at a controller output, an acceleration electrode, which is electrically connected to the high-voltage output, for accelerating the particles in a particle beam to a kinetic energy that corresponds to the high voltage, a focusing lens, which is arranged in the beam path of the particle beam downstream of the acceleration electrode, for focusing the beam onto a sample, a monochromator, which is arranged in the beam path of the particle beam upstream of the focusing lens and is configured to allow only those particles of the particle beam to pass whose kinetic energy is within an adjustable energy interval, a detector, which is arranged in the beam path of the particle beam system downstream of the sample, for detecting particle beam intensities, and a controller, which is connected to the controller output of the high-voltage source and is configured to control the monochromator such that a central energy of the energy interval changes in dependence on the control signal provided by the high-voltage source.

According to a still further exemplary embodiment, the particle beam system comprises a high-voltage source for providing a high voltage at a high-voltage output and providing a control signal, which is indicative of a deviation of the provided high voltage from a reference voltage, at a controller output, an acceleration electrode, which is electrically connected to the high-voltage output, for accelerating the particles in a particle beam to a kinetic energy that corresponds to the high voltage, a focusing lens, which is arranged in a beam path of the particle beam system downstream of the acceleration electrode, for focusing the beam onto a sample, an energy-dispersive component, which is arranged in the beam path downstream of the sample and is configured to deflect particles of different kinetic energies differently, a detector, which is arranged in the beam path downstream of the energy-dispersive component, and a controller, which is connected to the controller output of the high-voltage source and is configured to control the energy-dispersive component such that a dispersion by the energy-dispersive component changes in dependence on the control signal provided by the high-voltage source.

Similar to the case where the previously described beam deflector, which is arranged in the beam path of the particle beam system downstream of the energy-dispersive component, is used, it is possible, by controlling the energy-dispersive component itself, to compensate for changes, caused by changes in the high voltage, in an energy spectrum of the particle beams, which is recorded with the aid of the detector, such that the same energy loss spectra can be recorded for different high voltages.

According to a still further exemplary embodiment, the particle beam system comprises a high-voltage source for providing a high voltage at a high-voltage output and providing a control signal, which is indicative of a deviation of the provided high voltage from a reference voltage, at a controller output, an acceleration electrode, which is electrically connected to the high-voltage output, for accelerating the particles in a particle beam to a kinetic energy that corresponds to the high voltage, a focusing lens, which is arranged in a beam path of the particle beam system downstream of the acceleration electrode, for focusing the beam onto an object plane, a detector, which is arranged in the beam path downstream of the object plane, and a controller, which is configured to record, with the aid of the detector, energy spectra of the particles contained in the particle beam downstream of the object plane. A plurality of energy spectra are successively recorded and manipulated here by shifting each of the energy spectra in the direction of the energy by an amount that is determined in dependence on the control signal provided by the high-voltage source. The spectra thus manipulated are then added up to a total spectrum. It is possible in this manner to compensate for changes, caused by changes in the high voltage, in the spectra measured with respect to the energy thereof such that the individual measured spectra are in each case representative of identical energy loss spectra which can be superposed in order to increase a statistical significance of the spectra.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
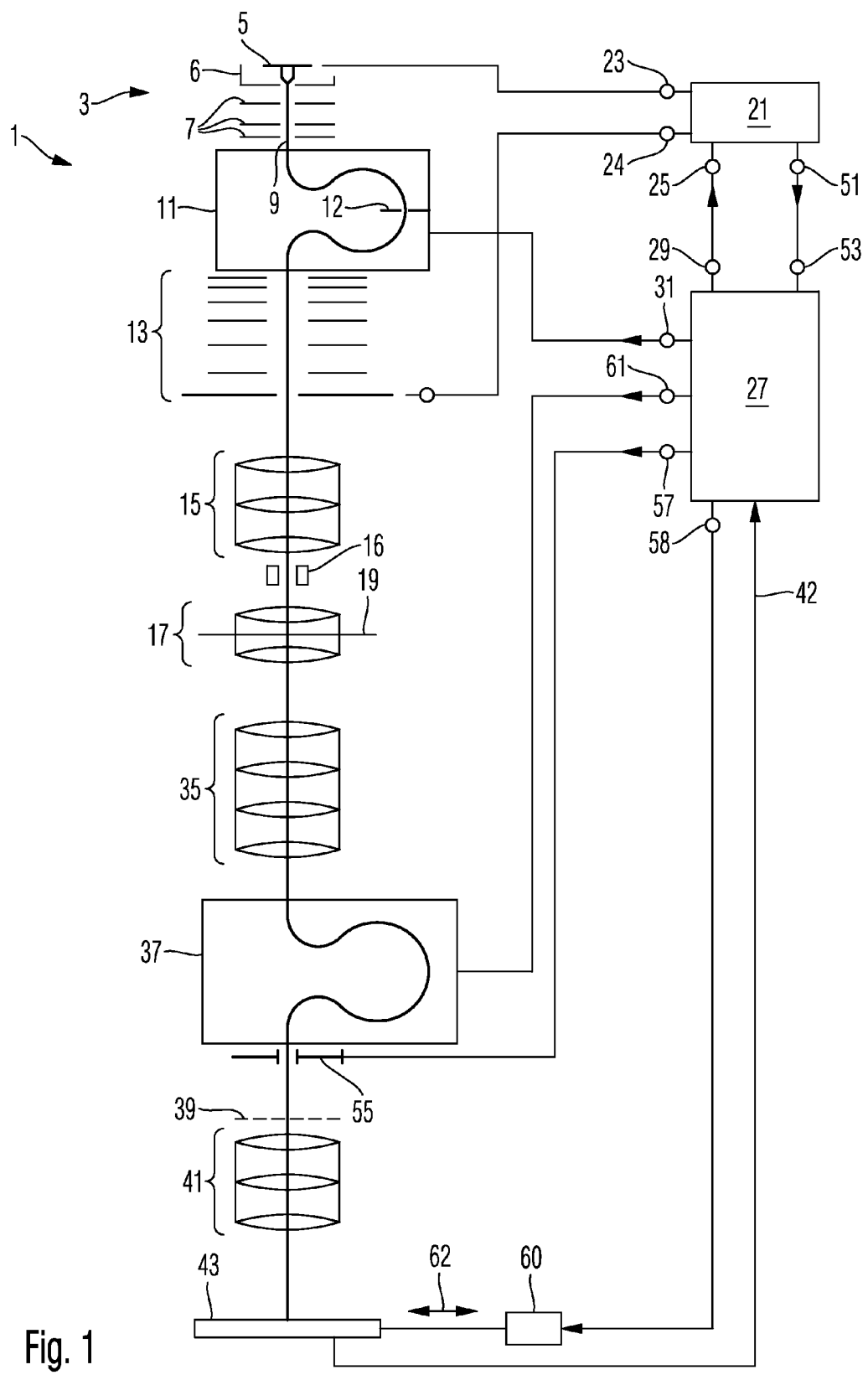
FIG. 1 is a schematic illustration of a particle beam system.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 schematically shows a particle beam system 1 suitable for recording energy loss spectra. The particle beam system 1 is a transmission electron microscope (TEM) comprising a particle beam source 3 having an emitter 5, an extractor electrode 6 and a plurality of other electrodes 7 for generating an electron beam 9. The electron beam source can be, for example, a Schottky field emission source, which for example generates a beam current of 100 pA with an energy width of 0.7 eV.

The particle beam system 1 may comprise a monochromator 11, which is configured to allow only those electrons of the particle beam to pass whose kinetic energy is within an adjustable energy interval. To this end, the monochromator comprises a plurality of electrodes (not shown in FIG. 1) in order to guide the electron beam 9 in the illustrated Ω-shaped path. An aperture plate 12 is arranged in the beam path, wherein only particles of the beam whose kinetic energy is within the set energy interval may traverse an aperture of the plate 12. One example of a suitable monochromator is described in the patent specification U.S. Pat. No. 6,770,878

B2, the disclosure of which is incorporated in its entirety in the present application. With a suitable monochromator it is possible to limit the width of the energy interval for example to 50 meV.

The monochromator 11 is merely optional in the particle beam system and can be omitted if an energy width of the electron beam provided by the electron source 3 is already less than or equal to an energy width desired for the examination to be carried out.

A plurality of acceleration electrodes 13 are arranged in the beam path of the particle beam system 1 downstream of the monochromator for accelerating the electrons of the electron beam 9 to a kinetic energy of, for example, 200 keV, while their energies before traversing the acceleration electrodes 13 was, for example, 4 keV. In the illustrated example, the monochromator 11 is arranged between the electron source 3 and the acceleration electrodes 13, with the result that comparatively small deflection fields are necessary to guide the electron beam on a curved path required for monochromatization. However, it is also possible to arrange a monochromator in the beam path downstream of the acceleration electrodes 13 and to monochromatize the electron beam of high kinetic energy.

After acceleration, the electron beam 9 traverses a condenser system 15 and is then focused at an object plane 19 by a single-field condenser objective lens 17. A sample to be examined is arranged in the object plane 19 which is traversed by the particle beam 9. A beam deflector 16 may be provided in the beam path upstream of the object plane 19 in order to scan the beam over the object plane 19 and direct it onto selected locations of a sample. Depending on the design of the system and in particular of the condenser lens, the electron beam in the sample plane can have diameters that are smaller than 0.2 nm, for example.

The kinetic energy of the electrons of the beam 9 that are traversing the sample plane 19 is defined by a voltage difference between an area surrounding the sample plane 19 and the emitter 5 of the electron source. Typically the sample arranged in the object plane 19 is kept at ground potential and the emitter 5 at high-voltage potential. However, it is also possible to deviate from this. In any case a high-voltage source 21 is necessary in order to provide the necessary high potential difference between the emitter 5 and the sample. In the exemplary embodiment illustrated, a high-voltage output 23 of the high-voltage source 21 is electrically connected to the emitter 5 so as to keep the latter at a high electric potential with respect to earth.

The high-voltage source 21 further comprises a control input 25 in order to be supplied with a control signal which is indicative of a reference voltage for the high voltage to be provided at the high-voltage output 23. This control signal is generated by and supplied from a controller 27 via an output 29 of the controller 27.

The controller 27 further comprises an output 31 for controlling the monochromator 11 and for setting a central energy of the interval of kinetic energies which are allowed to traverse the monochromator 11.

Here, the electric potentials to be applied to the electrodes 6, 7, the components of the monochromator 11 and the acceleration electrodes 13 are high-voltage potentials which can be generated by separate high-voltage sources or using the high-voltage source 21 together with auxiliary circuits such as voltage dividers and/or low-voltage sources. The monochromator 11 in that case is for example not connected directly to the output 31 of the controller 27 but to a suitable auxiliary circuit, such as a voltage divider, that is connected to the high-voltage source, for generating the voltages suitable for controlling the monochromator 11.

The electrons of the electron beam 9, which are directed onto the sample, interact with the sample and can excite said sample, in which case individual electrons lose an amount of energy that corresponds to the excitation energy of an excitation of the sample. Therefore it is of interest to determine the energy spectrum of the electrons of the electron beam after interaction with the sample to obtain information relating to the possible excitations of the sample.

To this end, the particle beam system 1 comprises a projection system 35, which comprises one or more electron-optical lenses and is arranged in the beam path downstream of the objective lens 17. Arranged in the beam path downstream of the projective system 35 is an energy-dispersive electron-optical component 37, which provides different deflection angles for particles of different kinetic energies, such that a spatially resolved energy spectrum of the beam 9 is produced in a spectrum plane 39 in the beam path downstream of the energy-dispersive component 37. The energy-dispersive component 37 can be configured as is described, for example, in U.S. Pat. Nos. 4,740,704 and 6,384,412, wherein the disclosure of these documents is incorporated in its entirety in the present application.

The spectrum plane 39 is imaged onto a spatially resolving detector 43 using a further projection system 41, which may comprise one or more electron-optical lenses. The spatially resolving detector 43 can be configured, for example, as a line detector which is oriented such that particles of different energies are incident on the detector at different locations due to the dispersion by the energy-dispersive component 37. By spatially resolved detection of intensities of the incident particles it is thus possible to detect the intensities in an energy-resolved manner, i.e. to measure the energy spectrum of the electron beam 9 subsequent to its interaction with the sample.

Figure 2:
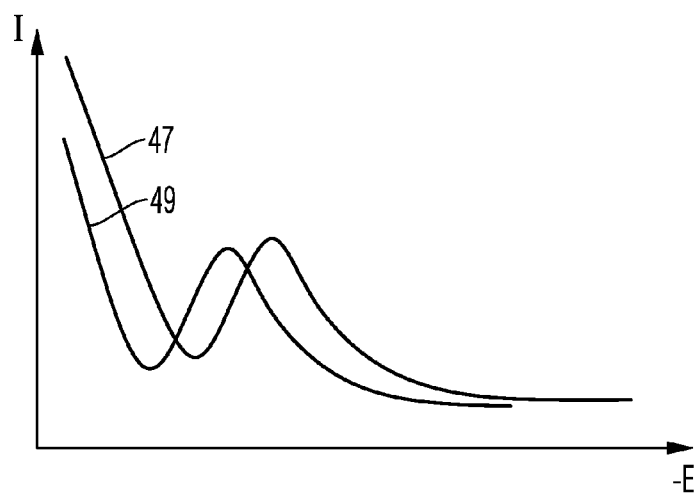
FIG. 2 is a graph of two energy loss spectra, recorded with the particle beam system illustrated in FIG. 1, for various values of a high voltage without compensation.

Line 47 in FIG. 2 schematically illustrates such an energy spectrum as can be recorded by the detector 43 if the high voltage provided by the high-voltage source 21 corresponds exactly to the reference voltage and a given sample is arranged in the object plane 19. Line 49 in FIG. 2 schematically represents a spectrum, recorded using the detector 43, as is formed for the same sample where however the high voltage provided by the high-voltage source 21 is greater than the reference voltage. This results in a higher kinetic energy of the electrons travelling through the sample and, owing to the dispersion by the energy-dispersive component 37, in a shift of the spectrum detected using the detector 43 to the left in the illustration of FIG. 2.

If the high-voltage source 21 is not sufficiently stable and the high voltage provided is subject to noise, this results in the spectrum in the illustration of FIG. 2 to being persistently displaced to and fro during the measurement using the detector 43 due to the dispersion by the energy-dispersive component 37. The spectrum finally obtained by integration is correspondingly smeared and thus prevents obtaining of certain information contained in the energy distribution of the electrons.

Since even conventional high-voltage sources of complex design are not sufficiently stable for high-resolution energy loss measurements, the particle beam system 1 has various options for compensating for fluctuations of the high-voltage source 21.

A temporal fluctuation of the high voltage provided at the output 23 of the high-voltage source 21 is determined in said high-voltage source 21 itself and provided, as an electric signal, at the control output 51 of the high-voltage source 21. The control output 51 is connected to an input 53 of the controller 27. The controller 27 can thus, via the input 53, read a signal that is indicative of the fluctuation in the high voltage provided or the deviation of the high voltage provided at the high-voltage output 23 from the reference voltage.

A first possibility of compensating for the fluctuations in the high voltage during the recording of energy loss spectra uses a beam deflector 55, which is arranged in the beam path downstream of the energy-dispersive component 37 and upstream of the detector 43. The beam deflector 55 can generate a magnetic and/or an electric field that deflects the electron beam 9. The beam deflector 55 is controlled by the controller 27, which provides a control signal at its output 57 for the deflector 55 which is determined by the controller 27 in dependence on the control signal of the high voltage. For example, the control signal can be determined such that a change in the deflection angle provided by the deflector 55 for the beam is proportional to a deviation of the provided high voltage from the reference voltage. The controller 27 here produces, in dependence on the control signal of the high-voltage source, a change in the deflection signal such that the deflection produced by the deflector 55 compensates for that shift of the electron spectrum on the detector which corresponds to the energy deviation of the electrons from the reference energy, caused by the deviation of the high voltage from the setpoint voltage, and to the shift of the electron spectrum on the detector, caused therefrom due to the dispersion by the energy-dispersive component 37.

By controlling the deflector 55 in dependence on the deviation of the provided high voltage from the reference voltage it is possible to largely avoid the shift of the spectra due to the deviation of the high voltage, explained previously in conjunction with FIG. 2.

A second possibility of avoiding such shifts, which can be used alternatively to or complementary with the previously described first possibility, is controlling of the monochromator 11 in dependence on the deviation of the provided high voltage from the reference voltage. Here the controller 27 controls, via its output 31, the monochromator 11 such that the central energy of the interval of kinetic energies of the electrons, which are allowed to pass through the monochromator 11, is increased or decreased if the high voltage provided decreases or increases, respectively, due to the determined temporal fluctuations.

A third possibility for avoiding the deterioration of the detected energy spectra due to the deviation of the provided high voltage from the reference voltage, which can be used alternatively or in addition to one or both of the possibilities described previously, involves the energy-dispersive component 37 being controlled by the controller 27 via an output 61 thereof in dependence on the fluctuation of the high voltage provided or in dependence on the deviation of the provided high voltage from the reference voltage. This may achieve an effect similar to that of the deflector 55 and results in a shift of a spectrum of electrons impacting the detector 43 due to changes in the high voltage does not take place, or takes place only to a very limited extent.

A fourth possibility of avoiding the smearing of the measured spectrum due to fluctuations of the high voltage, which can be used alternatively to or in combination with one or more of the possibilities described previously, involves the controller 27 reading in quick succession a plurality of spatially resolved intensity spectra from the detector 43 via a data line 42. To this end, the detector can be a CMOS sensor, for example, which allows a particularly quick reading operation.

The controller reads the intensity values, which were detected in a spatially resolved manner by the detector 43, together with a value of the control signal, which is representative of the current deviation of the provided high voltage from the reference voltage. In dependence on this deviation, each spectrum that is read from the detector 43 is corrected by shifting the respective measured values towards higher or lower energies, wherein the value of the shift is determined in dependence on the respective deviation of the provided high voltage from the setpoint voltage. Thus each of the read spectra is corrected with respect to the deviation of the provided high voltage from the reference voltage such that in the end the plurality of spectra can be added up to obtain a total spectrum of high statistical significance that is not smeared due to the fluctuations of the provided high voltage.

A fifth possibility for avoiding the smearing of the measured spectrum due to fluctuations of the high voltage, which can be used alternatively to or in combination with one or more of the possibilities described previously, involves an actuator 60, which may for example include an electric motor or piezo actuator, being actuated by the controller 27 via an output 58 thereof, wherein the actuator 60 is configured to displace the spatially resolving detector 43 transversely to an incidence direction of the beam 9 on the detector in a lateral direction illustrated by an arrow 62. This can achieve an effect similar to that of the previously described deflector 55 and results in a shift of the spectrum of electrons incident on the detector 43 due to changes in the high voltage taking place to a comparatively limited extent.

Figure 3:
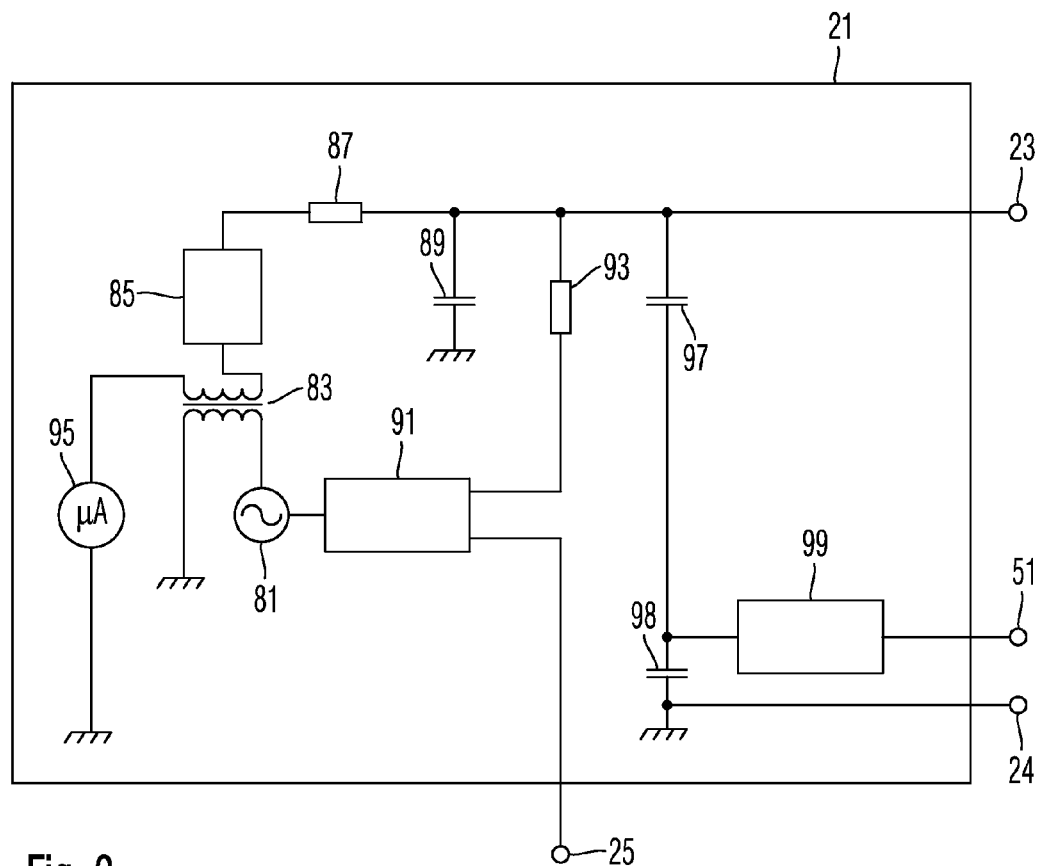
FIG. 3 is a schematic illustration of a high-voltage source which can be used in the particle beam system illustrated in FIG. 1.

FIG. 3 is a schematic diagram of an exemplary embodiment of a high-voltage source 21.

The high-voltage source 21 provides a high voltage of for example 200 kV between the connections 23 and 24. Here, the connection 24 may be connected to an internal ground of the high-voltage source 21, which in turn is connected to a ground of the particle beam system 1. The high-voltage source 21 further comprises the control input 25 for setting the reference value of the high voltage to be provided between the connections 23 and 24, wherein a signal, which is representative of the instantaneous deviation of the high voltage provided between the connections 23 and 24 from their reference value, is output at the control output 51.

The high-voltage source 21 comprises an alternating voltage generator 81, which generates an alternating voltage with a given voltage amplitude. This alternating voltage is transformed in a transformer 83 into an alternating voltage with a higher voltage amplitude. On the basis of this alternating voltage with higher voltage amplitude, a high-voltage converter 85, such as a Cockroft-Walton generator for example, generates a rectified high voltage, which is smoothed by one or more filter resistors 87 and filter capacitors 89, such that the smoothed high voltage is available at the connection 23.

The magnitude of the high voltage is determined via an amplitude controller 91, which controls the voltage amplitude of the alternating voltage generator 81. To this end, a voltage signal is supplied to the amplitude controller 91 via a measurement resistor 93, which voltage signal is indicative of the magnitude of the high voltage provided between the connections 23 and 24, wherein, in the amplitude controller 91, this supplied voltage is compared with the voltage supplied to the high-voltage source 21 via the connection 25 and, in dependence on this comparison, the voltage amplitude of the alternating voltage generator is increased or decreased. The controller 27 can thus control the magnitude of the high voltage provided between the connections 23 and 24 via the connection 25.

A load current measurement instrument 95 is provided for measuring the current flowing between the connections 23 and 24.

A capacitive voltage divider having capacitors 97 and 98 is provided between the connectors 23 and 24, wherein an amplifier 99 amplifies the voltage present between the capacitors 97 and 98 and provides a signal corresponding to the amplified voltage at the output 51 such that a signal is output via the output 51 to the controller 27 of the particle beam system 1, which signal corresponds to the instantaneous temporal change in the high voltage provided between the connections 23 and 24 and thus to the deviation thereof from its reference value.

In the previously explained exemplary embodiments, the detector 43 is a linear detector detecting an energy spectrum of the electron beam which is incident on it. However, it is likewise possible to detect an energy spectrum with a non-spatially resolving detector, by moving this detector or an aperture associated therewith, which is arranged in the beam path downstream of the energy-dispersive component 37, transversely to the beam direction, and the intensities detected by the detector are recorded in dependence on the position of the aperture or the detector, respectively. It is furthermore possible for a two-dimensionally resolving detector to be used to detect the energy spectrum.

In the previously explained exemplary embodiments, the particle beam system is a transmission electron microscope.

However, the present disclosure is not limited thereto. In further possible exemplary embodiments, the particle beam system can be a transmission ion microscope. One example of this is a gas field ion microscope, in which an ion beam is generated by ionizing gas atoms in an electrostatic field of an emission peak. The object is then irradiated with an ion beam, wherein ions transmitted through the object can lose energy, with the result that their energy loss spectrum, too, can be detected. If the particle beam apparatus is an ion microscope, the objective lens can be a magnetic lens, an electrostatic lens or a combination of a magnetic lens and an electrostatic lens.

In the previously explained exemplary embodiments, the particle beam system has a monochromator arranged in the beam path upstream of the objective lens. This does not necessarily have to be the case. In other exemplary embodiments, no monochromator is provided between the particle source and the object. In particular, a monochromator is not necessary where an energy width of the particle beam produced by the particle source is sufficiently small for desired examination. This can be the case in particular for cooled ion sources or electron sources.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A transmission electron microscope (TEM) comprising:
a high-voltage source configured to supply a high voltage to two high-voltage outputs and and to supply a control signal to a controller output, wherein the control signal is indicative of at least one of a deviation of the supplied high voltage from a reference voltage and temporal fluctuations of the supplied high voltage;
an acceleration electrode configured and arranged to accelerate electrons of an electron beam to a kinetic energies corresponding to the high voltage, wherein the acceleration electrode is electrically connected to one of the two high-voltage outputs;
a focusing lens configured and arranged to focus the electron beam onto a location in an object plane, wherein the focusing lens is arranged in a beam path of the electron beam system downstream of the acceleration electrode;
an energy-dispersive component configured and arranged to deflect electrons of different kinetic energies differently, wherein the energy-dispersive component is arranged in the beam path downstream of the object plane;
a detector arranged in the beam path downstream of the energy-dispersive component; and
a controller connected to the controller output of the high-voltage source, wherein at least one of the following holds:
(a) the controller is configured to control a beam deflector, which is arranged in the beam path downstream of the energy-dispersive component and upstream of the detector, such that a deflective effect of the beam deflector on the electron beam changes in dependence on the control signal supplied by the high-voltage source;
(b) the controller is configured to control a monochromator, which is arranged in the beam path upstream of the focusing lens, such that only electrons of the electron beam having a kinetic energies from within an adjustable energy interval are allowed to traverse the monochtomator and such that a central energy of the energy interval changes in dependence on the control signal supplied by the high-voltage source;
(c) the controller is configured to control the energy-dispersive component such that a dispersion by the energy-dispersive component changes in dependence on the control signal supplied by the high-voltage source;
(d) the controller is configured to collect a plural intensity distributions detected by the detector and to accumulate the plural intensity distributions, wherein the intensity distributions are offset relative to one another by an amount which is determined in dependence on the control signal supplied by the high-voltage source; and
(e) the controller is configured to control an actuator configured to displace the detector in a direction transverse to the beam path in dependence on the control signal supplied by the high-voltage source.

2. A method of operating a transmission electron microscope, the method comprising:
generating a high voltage;
accelerating electrons of an electron beam to a kinetic energies which correspond to the high voltage;
directing the electron beam onto an object;
measuring intensities of the electrons of the electron beam having interacted with the object in dependence on the kinetic energy of the electrons;
detecting deviations of the generated high voltage from a reference voltage; and
performing at least one of:
(a) deflecting the electron beam between the object and a detector in dependence on the detected deviations of the generated high voltage;
(b) monochromatizing the electron beam such that the kinetic energies of the electrons of the electron beam are in a selected energy interval, and changing the selected energy interval in dependence on the detected deviations;
(c) changing a dispersion of an energy-dispersive component traversed by the electron beam in dependence on the detected deviations;
(d) repeatedly measuring intensities of the electrons of the electron beam having interacted with the object in dependence on the kinetic energies of the particles, wherein the measured intensities of plural measurements are corrected with respect to the kinetic energies of the electrons in dependence on the detected deviations and wherein the corrected intensities are accumulated to form an accumulated spectrum; and (e) displacing a detector used for measuring the intensities of the electrons relative to the object in dependence on the detected deviations.

* * * * *